United States Patent [19]
Keeth

[11] Patent Number: 5,698,972
[45] Date of Patent: Dec. 16, 1997

[54] VOLTAGE REGULATOR CIRCUIT

[75] Inventor: Brent Keeth, Boise, Id.

[73] Assignee: Micron Technology, Inc., Boise, Id.

[21] Appl. No.: 804,945

[22] Filed: Feb. 24, 1997

Related U.S. Application Data

[63] Continuation of Ser. No. 521,563, Aug. 30, 1995, abandoned.

[51] Int. Cl.$^6$ .................................................. H02J 1/04
[52] U.S. Cl. .................................................. 323/349
[58] Field of Search .................................. 323/316–320, 323/313–315, 59–61, 275–280; 330/257–258

[56]  References Cited

U.S. PATENT DOCUMENTS

| | | | |
|---|---|---|---|
| 4,142,114 | 2/1979 | Green | 307/304 |
| 4,419,594 | 12/1983 | Gemmell et al. | 307/297 |
| 4,581,546 | 4/1986 | Allan | 307/297 |
| 5,077,518 | 12/1991 | Han | 323/275 |
| 5,335,202 | 8/1994 | Manning et al. | 365/222 |
| 5,412,309 | 5/1995 | Ueunten | 323/316 |
| 5,455,794 | 10/1995 | Janamifard, et al. | 365/185 |

OTHER PUBLICATIONS

Baker, et al., "CMOS Circuit Design, Layout and Simulation with LASI The LAout/System for Individuals", internet Apr., 1966 URL Address: http://www.engboi.uidaho.edu/lan–group/jbaker/book.htm.

Mel Bazes, "Two Novel Fully Complementary Self–Biased CMOS Differential Amplifiers", *IEEE Journal of Solid–State Circuits*, vol. 26, No. 2, 165–168, (Feb., 1991).

*Primary Examiner*—Aditya Krishnan
*Attorney, Agent, or Firm*—Schwegman, Lundberg, Woessner & Kluth, P.A.

[57]  ABSTRACT

A power regulation circuit features an improved regulation circuit for use with a voltage multiplier circuit, such as a Vccp pump for a DRAM. The power regulation circuit includes: a high-gain differential comparator, dual input level translators, and a constant current bias generator. The dual input level translators lower the respective voltage levels of a reference voltage level and the output of the power regulation circuit, which is monitored to provide the desired regulation. The translated input signals are coupled as inputs to the differential comparator. Translation keeps the inputs within the input common mode range of the differential comparator. The differential comparator acts in concert with the constant current bias generator to regulate the output of the power regulation circuit at a constant and steady level. Using current mirrors, the constant current bias generator provides a fixed voltage for ensuring that approximately the same amount of current passes through each of the dual level translators. Feedback is provided from the output of the regulation circuit to the differential comparator to provide the desired level of hysterisis control.

7 Claims, 4 Drawing Sheets

VOLTAGE REGULATOR CIRCUIT

This is a continuation of U.S. Pat. application Ser. No. 08/521,563, filed on Aug. 30, 1995 now abandoned.

REFERENCE TO RELATED APPLICATION

Reference is made to co-pending application entitled "Differential Voltage Regulator," Ser. No. 08/668,347, filed on Jun. 26, 1996, and which is assigned to the same assignee as the present application.

FIELD OF THE INVENTION

The present invention relates generally to semiconductor devices, such as memory chips. More particularly, the present invention relates to differential voltage regulators used in semiconductor devices.

BACKGROUND OF THE INVENTION

A semiconductor device may be designed for any of a wide variety of applications. Typically, the device includes logic circuitry to receive, manipulate or store input data. The circuitry subsequently generates the same or modified data at an output terminal of the device. Depending on the type of semiconductor device or the circuit in which it is used, the device typically includes circuits which provide internal power signals that are regulated to be substantially independent of fluctuations in the externally generated power input signal(s).

An example of a data storage or memory device having such internal power signal circuits is the DRAM (dynamic random access memory). Conventionally, the DRAM receives an external power signal (Vccx) having a voltage intended to remain constant, for example, at 4.5 volts measured relative to ground. Internal to the DRAM, the power regulation circuit maintains an internal operating voltage signal (Vcc) at a designated level, for example, 2.5 volts. Ideally, Vcc linearly tracks Vccx from zero volts to the internal operating voltage level, at which point Vcc remains constant as Vccx continues to increase in voltage to the designated Vccx level.

DRAMs also typically include a regulated constant pumped supply voltage (Vccp) which is greater than Vcc, for example, four volts. Conventionally, the pumped voltage drives the word lines of a DRAM. The DRAM has memory arrays consisting of a number of intersecting row and column lines of individual transistors or memory cells. The pumped voltage needs to be greater than Vcc to ensure that memory access operations, such as a memory cell read or a memory cell write, are performed both completely and quickly. Ideally, Vccp does not fluctuate. If Vccp is too high, damage to the memory cells may result. If it is too low, the memory chip may have poor data retention or may otherwise operate incorrectly. Depending on the type of memory device, the device may include a second circuit for providing this internal regulated pumped power signal.

Previously implemented CMOS power regulation circuits for regulating Vccp include an input stage comprising a series of diodes and an inverter circuit having a "trip point" to trigger the point at which the inverter circuit activates the charge pump for Vccp. The series of diodes, which are implemented through a combination of PMOS/NMOS transistors, are used to translate the Vccp signal down to the input trip point range for controlling the inverter circuit. The inverter circuit provides an output signal which drives an amplifier (implemented as a series of inverters) to bring the output signal to full CMOS levels.

This type of CMOS power regulation circuit, while useful in many applications, is disadvantageous. Theoretically, the input stage can be designed such that the voltage drop of the diodes is predictable and constant, allowing for a steady and regulated Vccp. In actuality, however, this type of regulator can be unpredictable from a design standpoint, because the actual Vccp level is determined by the interaction of the current passing through the series of diodes, the voltage drop across the diodes, the trip point of the inverter circuit, and the cumulative gain created by the series of inverters. Possible variations in these interactive factors make design implementation difficult to achieve, and the actual Vccp level difficult to predict and maintain at a desired voltage level. Further, this type of design can result in the generation of high crossing currents when operating near the trip point of the inverter circuit.

Accordingly, there is a need for an improved CMOS voltage regulator that overcomes the above-mentioned deficiencies. The present invention provides an alternative solution to these and other problems, offering advantages over the prior art.

SUMMARY OF THE INVENTION

In an exemplary embodiment of the present invention, a voltage regulator accurately regulates an output signal at a voltage level relative to a reference voltage level provided by a reference signal. The output signal is maintained at a level which is greater than the reference voltage level. The voltage regulator comprises: a first terminal providing the reference signal; a second terminal providing a signal, Vout, representing the regulated output signal; a first voltage reduction circuit coupled to the first terminal and providing a reduced reference signal that represents the voltage level of the reference signal reduced by a first measurable amount; a second voltage reduction circuit coupled to the second terminal and providing a reduced Vout signal that represents the voltage level of Vout reduced by an amount equal to the sum of the first measurable amount plus the difference between the levels of the output signal and the reference signal; a differential comparator circuit having a first input port receiving the reduced reference signal and having a second input port receiving the reduced Vout signal, the differential comparator circuit providing an indicator signal to indicate when the regulated output signal should be adjusted; and a circuit responding to the indicator signal by adjusting the level of the output signal.

In another exemplary embodiment, the present invention is implemented in the form of a power regulation circuit for use in a semiconductor memory device having a regulated power source, such as a regulator pump circuit using a voltage multiplier. The power regulation circuit includes: a high-gain differential comparator, dual input level translators, and a constant current bias generator. The dual input level translators lower the respective voltage levels of a reference voltage level and the output of the power regulation circuit, which is monitored to provide the desired regulation. The translated input signals are coupled as inputs to the differential comparator. Translation is necessary to ensure that the inputs do not exceed the input common mode range of the differential comparator. The differential comparator acts in concert with the constant current bias generator to regulate the output of the power regulation circuit at a constant and steady level.

Preferably, the constant current bias generator provides a fixed reference voltage for ensuring that approximately the same amount of current passes through each of the dual level translators.

The above summary of the present invention is not intended to present each embodiment or every aspect of the present invention. This is the purpose of the figures and the associated description which follow.

BRIEF DESCRIPTION OF THE DRAWINGS

Other aspects and advantages of the present invention may become apparent upon reading the following detailed and upon reference to the figures in which.

Figure 1:
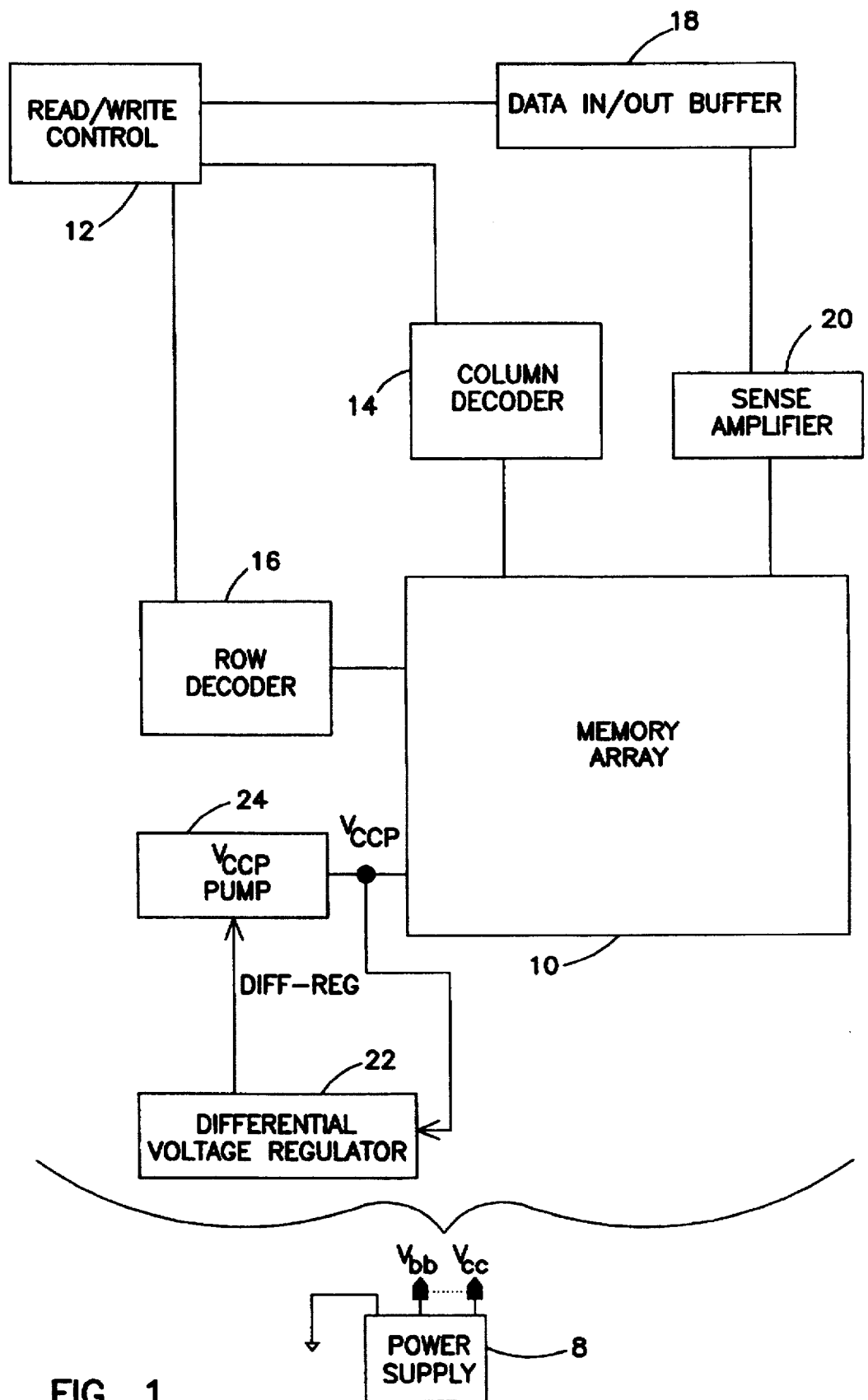
FIG. 1 is a block diagram of a DRAM exemplifying a semiconductor device incorporating the principles, of the present invention.

While the invention is susceptible to various modifications and alternate forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE DRAWINGS

The present invention has a variety of applications in semiconductor circuits requiring or benefiting from the inventive principles illustrated in the circuit shown in the figures. The block diagram of FIG. 1 is used to exemplify such a DRAM application employing the principles of the present invention.

In FIG. 1, a conventional power supply 8 provides regulated power signals to a memory array 10 and related memory access circuits. Such power signals include Vcc (the primary operating voltage for the semiconductor circuit) and Vbb (the voltage level to which the substrate voltage is regulated). The memory array 10 consists of a number of individual memory cells or transistors organized in rows and columns. Each memory cell can hold one of two states, corresponding to binary zero and binary one. For a data access (read or write) operation to be performed upon a particular memory cell within the array, a read/write control circuit 12 provides the row address of the cell to a row decoder 16 and the column address of the cell to a column decoder 14. Data in/out buffers 18 are used provide an interface for the data between the selected memory cell and external data (input/output) ports (not shown), which are coupled to the buffers 18. Sense amplifiers 20, which are directed by the read/write control circuit 12, are used to convert the information provided by the selected memory cell to the appropriate voltage level for the data in/out buffer 18. Control over the timing and direction of data flow is provided by the read/write control circuit 12. Each of the above circuits is well known in the art, for example, as described in connection with FIG. 1 of U.S. Pat. No. 5,335,202, which issued on Aug. 2, 1994.

To ensure accurate and fast access to the selected memory cells, a stable high-level "Vccp" voltage is provided to the memory array 10 at a voltage level which is greater than Vcc. In a typical DRAM application, the voltage for Vcc may be set to about 2.5 volts, thereby requiring Vccp to be set so as to safely operate more than one diode drop higher than Vcc. With Vcc set at 2.5 volts, designing Vccp for 4.0 volts would be an acceptable design criteria. As illustrated in FIG. 1, the purpose of the differential voltage regulator 22 and the Vccp pump circuit 24 is to provide Vccp at such a regulated level. The Vccp pump circuit 24 is conventional and may be implemented using any of a number of circuits. The differential voltage regulator 22, which is not conventional, is discussed in detail below in connection with FIGS. 2a and 2b.

Figure 2A:
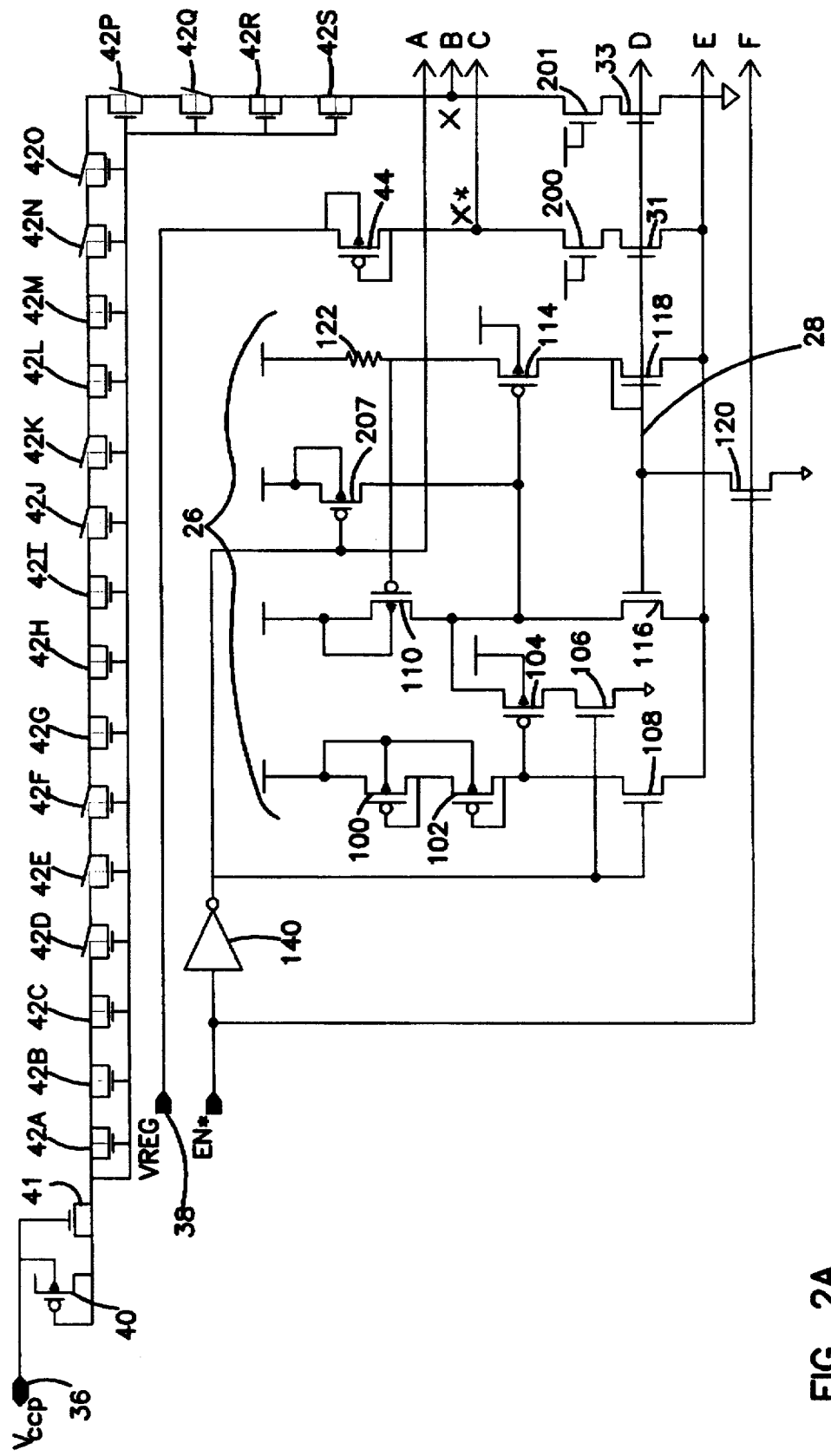
FIGS. 2A. 2B and 2C form a schematic diagram of a Vccp differential regulator circuit, as shown in FIG. 1, implemented in accordance with the present invention.
Figure 2B:
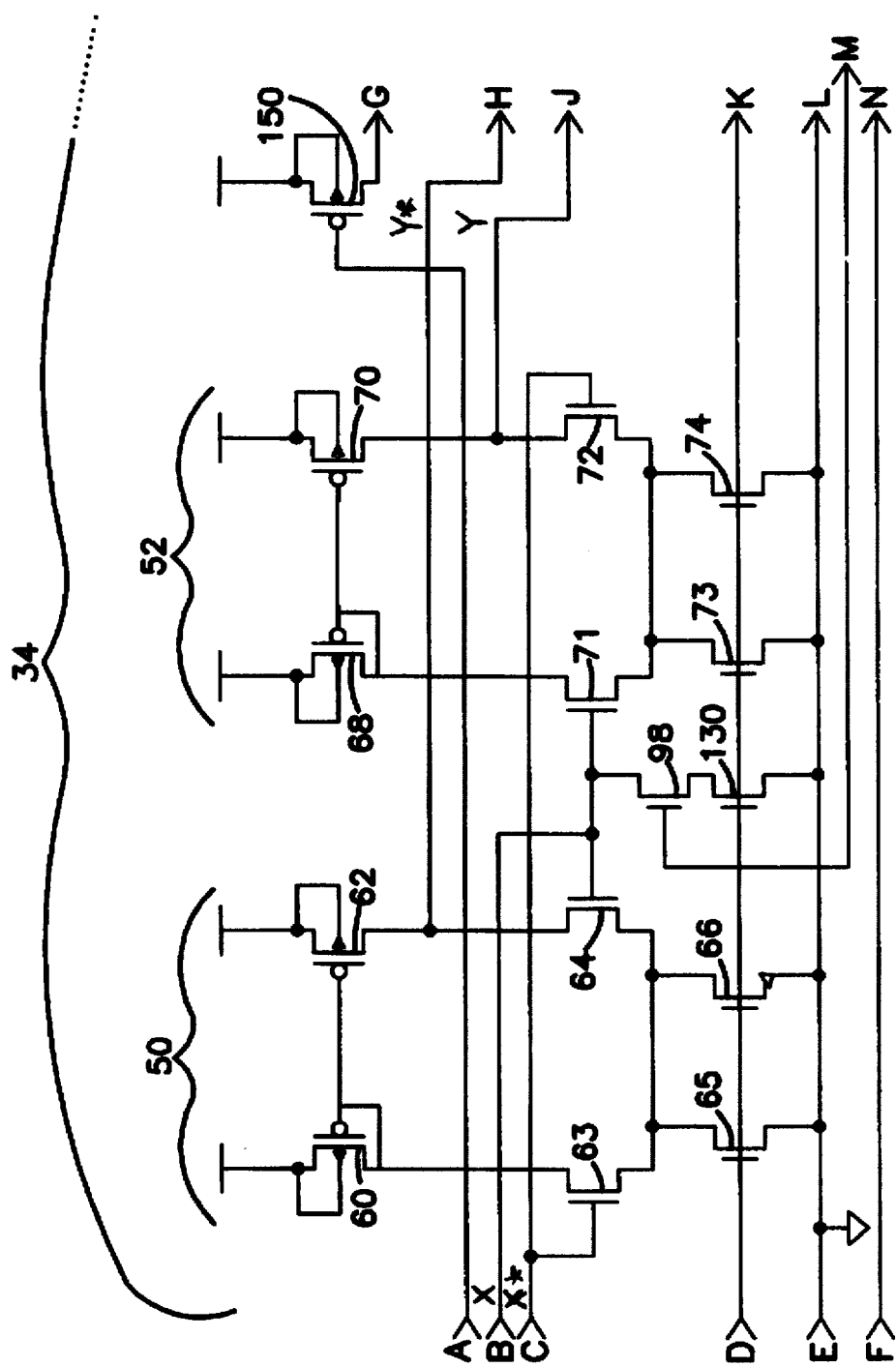
Figure 2C:
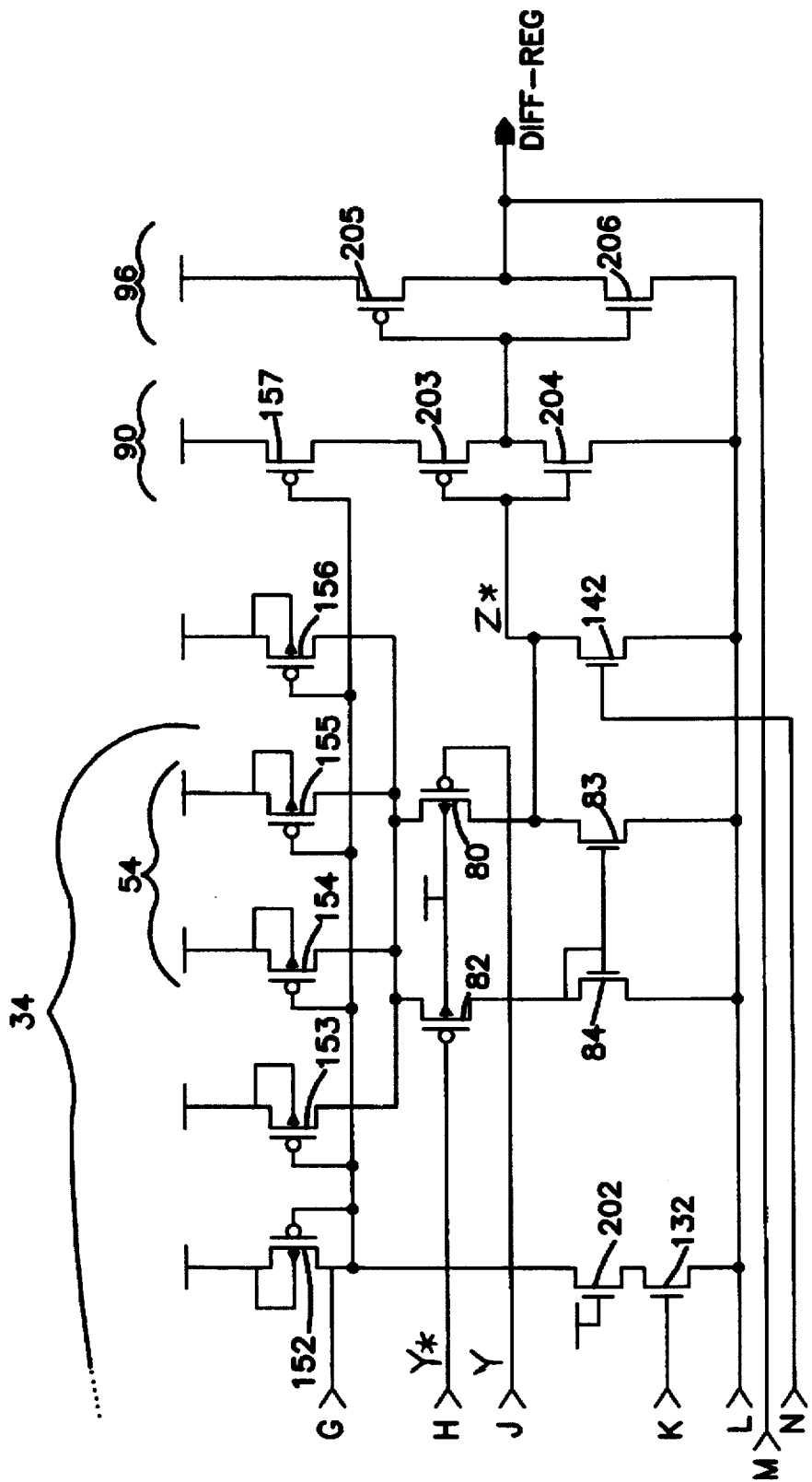

The differential voltage regulator 22 of FIGS. 2a, 2b and 2c is advantageous, because it maintains a stable Vccp by accurately comparing it to a reference voltage, without the typical guess work involved in determining the Vccp voltage level. The differential voltage regulator employs a constant current bias generator, having a current source circuit 26 and a current mirror control signal 28, and a differential comparator circuit 34 to compare the voltage level at Vccp terminal 36 to the reference voltage level at Vreg terminal 38. For the purpose of simplifying the following discussion of the exemplary application illustrated in the figures, it is assumed that Vreg=Vcc=2.5 volts, and that Vccp=4.0 volts.

Because the differential comparator circuit 34 operates based at the Vcc supply voltage level and the Vccp level at terminal 36 is substantially higher than the Vcc level, Vccp and Vreg are translated down to acceptable voltage levels within the input common mode range of the differential comparator circuit 34. Circuits 40 and 42 are used to translate the Vccp level, and circuit 44 is used to translate the Vreg level. Circuit 42 is a series of diode-configured NMOS transistors, providing the sufficient threshold voltage to offset the 1.5 volts difference between Vreg and Vccp. An NMOS transistor 41 is arranged as a capacitor to provide fast coupling around the circuit 40, should the signal level at terminal 36 suddenly drop. Diode-configured PMOS transistor circuits 40 and 44 are identically implemented in series between the respective terminals 36 and 38 and the inputs of the differential comparator circuit 34, so that the effect of each circuit 40 and 44 cancels the other, as presented at the inputs, X* and X, of the differential comparator circuit 34. To ensure that the voltage drops through the Vreg leg (through circuit 44) matches the voltage drops through the Vccp leg (through circuit 40), the control signal 28 sets the voltage at the gates of transistors 31 and 33 to a fixed level.

The differential comparator circuit 34 is implemented to provide high gain. The illustrated implementation includes three subcircuits, input differential comparators 50 and 52 (receiving X and X* as inputs) and output differential comparator 54. The input differential comparator 50 includes PMOS transistors 60 and 62 and NMOS transistors 63, 64, 65 and 66. When the X (Vccp) input to transistor 64 is determined to be less than the X* (Vreg) input, the input differential comparator 50 indicates that the Vccp pump 24 (FIG. 1) should be activated. The contrary is also true. That is, when the X (Vccp) input to transistor 64 is determined to be greater than the X* (Vreg) input, the input differential comparator 50 indicates that the Vccp pump 24 (FIG. 1) should not be activated. The output of the input differential comparator 50, which provides this indication, is denoted as Y*.

The input differential comparator 52 includes PMOS transistors 68 and 70 and NMOS transistors 71, 72, 73 and 74. Similar to the operation of the input differential comparator 50, when the X (Vccp) input to transistor 71 is determined to be less than the X* (Vreg) input, the input differential comparator 50 indicates that the Vccp pump 24 (FIG. 1) should be activated. As with the comparator 50, the converse is also true. The output of the input differential comparator 52, which provides this indication, is denoted as Y.

The output differential comparator 54 receives the outputs Y and Y* as inputs. These signals are received at the gates of PMOS transistors 80 and 82, with the comparator 54 providing a signal denoted as Z* at the drain of NMOS transistor 83. With the two input comparators 50 and 52 acting as first stage difference amplifiers for the inputs X and X*, the signal Z* provides a desirable additional level of gain for detecting and indicating even the slightest of signal swings between Y and Y* (and, therefore, X and X*). Although gain in the order of at least 50 (or 60) to 1 should be sufficient, the circuit 34 is preferably designed to provide gain in excess of 100 to 1. Accordingly, when the X (Vccp) input to the two input comparators 50 and 52 is determined to be less than the X* (Vreg) input, the input differential comparators 50 and 52 generate Y and Y*, such that Y* is greater than Y. This, in turn, is detected by the output comparator 54, which provides a high level Z* signal to indicate that the Vccp pump 24 (FIG. 1) should be activated.

From the output comparator 54, the Z* signal is inverted by a first inverter 90, which is designed to limit crossing currents, and inverted again by a second inverter 96, which provides the output (denoted "DIFF-REG") of the differential voltage regulator 22 illustrated in FIGS. 2A, 2B and 2C.

As feedback to the differential comparator circuit 34, the output ("DIFF-REG") of the differential regulator 22 is arranged to decrease the signal level at the X inputs to the differential comparators 50 and 52. This is accomplished by connecting the DIFF-REG output to the gate of NMOS transistor 98, which is then activated so that it pulls the signal at the X inputs toward common (or ground). By decreasing the signal level at the X (Vccp) input, the differential comparators 50 and 52 detect that even greater recovery of the Vccp voltage level is needed. Consequently, the DIFF-REG output signal causes the Vccp pump (24 of FIG. 1) to over react to the decrease in the Vccp level that was initially detected. In this manner, hysterisis is provided by the feedback connection between the output of the differential regulator 22 and the signal level at the X inputs to the differential comparators 50 and 52.

The current source circuit 26 shown in FIG. 2A includes a conventional bootstrap circuit (Vt referenced), comprising transistors 100, 102, 104, 106 and 108, and a conventional current source, comprising transistors 110, 114, 116, 118, 120, 207 and resistor 122. The circuit, which is controlled by the voltage developed across the transistor 110 and resistor 122, controls the current source so as to provide the appropriate Vgs voltage at transistor 118. The Vgs voltage at transistor 118 provides the current-mirror control signal 28, which connects to the respective gates of transistors 31, 33, 65, 66, 73 and 74 and transistors 130 and 132.

The remaining input port to the differential voltage regulator 22 is "EN*", which receives an enable signal a short time after power is applied to the application circuit (for example, the DRAM), and after the power supply voltages stabilize. So long as the enable signal (EN*) is at a logic high level, the current source is disabled through transistor 120 and via inverter 140) transistor 207, and the signal Z* is effectively disabled through transistor 142. Further, when the enable signal (EN*) is at a logic high level, through transistor 150, power to the differential comparator 54, and the inverter circuit 90 is disabled.

For a computer simulation, the components used are identifiable by the following characteristics, where the "numerator/denominator" represents the transistor size ("width/length"), and the "LIF" (local implant for field) notation represents an adjustment to the transistor "$V_t$" for matching to the $V_t$ of the (DRAM) memory access device:

| Ref. No. | Component Type | Drawing Size | Other |
|---|---|---|---|
| 31 | NMOS Transistor | 24/1.4 | |
| 33 | NMOS Transistor | 24/1.4 | |
| 40 | PMOS Transistor | 20/2 | |
| 41 | NMOS Transistor | 30/30 | |
| 42a | NMOS Transistor | 4/5 | LIF |
| 42b | NMOS Transistor | 4/10 | LIF |
| 42c | NMOS Transistor | 4/10 | LIF |
| 42d | NMOS Transistor | 4/10 | LIF |
| 42e | NMOS Transistor | 4/25 | LIF |
| 42f | NMOS Transistor | 4/10 | LIF |
| 42g | NMOS Transistor | 4/5 | LIF |
| 42h | NMOS Transistor | 4/5 | LIF |
| 42i | NMOS Transistor | 4/5 | LIF |
| 42j | NMOS Transistor | 4/5 | LIF |
| 42k | NMOS Transistor | 4/5 | LIF |
| 42l | NMOS Transistor | 4/3 | LIF |
| 42m | NMOS Transistor | 4/3 | LIF |
| 42n | NMOS Transistor | 4/3 | LIF |
| 42o | NMOS Transistor | 4/3 | LIF |
| 42p | NMOS Transistor | 4/1 | LIF |
| 42q | NMOS Transistor | 4/1 | LIF |
| 42r | NMOS Transistor | 4/1 | LIF |
| 42s | NMOS Transistor | 4/1 | LIF |
| 44 | PMOS Transistor | 20/2 | |
| 60 | PMOS Transistor | 20/1.4 | |
| 62 | PMOS Transistor | 20/1.4 | |
| 63 | NMOS Transistor | 20/1 | |
| 64 | NMOS Transistor | 20/1 | |
| 65 | NMOS Transistor | 48/1.4 | |
| 66 | NMOS Transistor | 48/1.4 | |
| 68 | PMOS Transistor | 20/1.4 | |
| 70 | PMOS Transistor | 20/1.4 | |
| 71 | NMOS Transistor | 20/1 | |
| 72 | NMOS Transistor | 20/1 | |
| 73 | NMOS Transistor | 48/1.4 | |
| 74 | NMOS Transistor | 48/1.4 | |
| 80 | PMOS Transistor | 20/1 | |
| 82 | PMOS Transistor | 20/1 | |
| 83 | NMOS Transistor | 15/1.4 | |
| 84 | NMOS Transistor | 15/1.4 | |
| 98 | NMOS Transistor | 24/4 | |
| 100 | PMOS Transistor | 20/1.4 | |
| 102 | PMOS Transistor | 20/1.4 | |
| 104 | PMOS Transistor | 20/1.4 | |
| 106 | NMOS Transistor | 20/1.4 | |
| 108 | NMOS Transistor | 10/1000 | |
| 110 | PMOS Transistor | 300/2 | |
| 114 | PMOS Transistor | 200/4 | |
| 116 | NMOS Transistor | 72/1.4 | |
| 118 | NMOS Transistor | 72/1.4 | |
| 120 | NMOS Transistor | 24/1 | |
| 122 | Resistor | 1,000,000 ohms | |
| 130 | NMOS Transistor | 6/1.4 | |
| 132 | NMOS Transistor | 24/1.4 | |
| 142 | NMOS Transistor | 10/1 | |
| 150 | PMOS Transistor | 20/1.4 | |
| 152 | PMOS Transistor | 40/1.4 | |
| 153 | PMOS Transistor | 40/1.4 | |
| 154 | PMOS Transistor | 40/1.4 | |
| 155 | PMOS Transistor | 40/1.4 | |
| 156 | PMOS Transistor | 40/1.4 | |
| 157 | PMOS Transistor | 1000/1.4 | |
| 200 | NMOS Transistor | 24/4 | |
| 20i | NMOS Transistor | 24/4 | |
| 202 | NMOS Transistor | 24/4 | |
| 203 | PMOS Transistor | 8/1.4 | |
| 204 | NMOS Transistor | 30/1.4 | |
| 205 | PMOS Transistor | 15/1.4 | |
| 206 | NMOS Transistor | 10/1.4 | |
| 207 | PMOS Transistor | 20/1.4 | |

For these components, the shrink factor is 0.24 and the length and width dimensions are tuned for the particular application specifications.

Accordingly, the present invention has been described by way of the above illustrations and discussion, using selected circuit structures for advantageous operation. For example, as used in the context of the exemplary DRAM application, the differential comparator provides for fast, predictable operation, and the current matching through the voltage-level translation circuits assists in providing accurate control over Vccp.

The illustrated embodiments may be changed, modified and/or implemented using various circuit types and arrangements. Those skilled in the art will readily recognize that such modifications and changes may be made to the present invention without strictly following the exemplary embodiments and applications illustrated and described herein, and without departing from the true spirit and scope of the present invention which is set forth in the following claims.

What is claimed is:

1. A memory device, comprising:

an array of storage cells for storing data for the memory device;

an address circuit coupled to the array that selects a cell of the array to be accessed;

a voltage pump coupled to the array that provides a regulated input voltage signal to the array of storage cells; and a voltage regulator coupled to the voltage pump and providing an output voltage signal that controls the voltage pump circuit to regulate the input voltage to the array of storage cells, the voltage regulator comprising:

a current source that generates a reference current;

a voltage translation circuit, coupled to and responsive to the current source, that translates the input voltage to generate a differential voltage; and a differential comparator circuit coupled to the voltage translation circuit that generates a control signal based on the differential voltage from the voltage translation circuit to indicate when the input voltage should be adjusted.

2. The memory device of claim 1, wherein the voltage translation circuit includes a first translator stage to offset the input voltage by a first amount and a second translator stage to offset a reference voltage by a second amount so as to place the input voltage and reference voltage within the common mode range of the differential comparator circuit.

3. The memory device of claim 2, wherein the first and second translator stages each comprise at least one diode coupled so as to translate the input and reference voltages, respectively.

4. The memory device of claim 3, wherein at least one diode of each of the first and second translator stages are matched to provide substantially the same voltage offset to both the input voltage and the reference voltage.

5. The memory device of claim 3, wherein the voltage translation circuit includes a diode, coupled to the current source, to offset the input voltage.

6. The memory device of claim 1, wherein the voltage translation circuit includes a current mirror that is coupled to the current source to establish the current in the voltage translation circuit.

7. The memory device of claim 2, wherein the output of the regulator is coupled as a feedback signal to the differential comparator to provide hysteresis.

* * * * *